United States Patent
Na et al.

(10) Patent No.: US 10,516,125 B1
(45) Date of Patent: Dec. 24, 2019

(54) ORGANIC LIGHT-EMITTING DISPLAY PANEL AND DISPLAY DEVICE

(71) Applicant: Shanghai Tianma AM-OLED Co., Ltd., Shanghai (CN)

(72) Inventors: Xiaoxi Na, Shanghai (CN); Jinghua Niu, Shanghai (CN); Xiangcheng Wang, Shanghai (CN); Qing Zhu, Shanghai (CN); Shuang Cheng, Shanghai (CN); Lei Wen, Shanghai (CN); Jun Lin, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/155,144

(22) Filed: Oct. 9, 2018

(30) Foreign Application Priority Data

May 31, 2018 (CN) .......................... 2018 1 0551430

(51) Int. Cl.
*H01L 29/08* (2006.01)
*H01L 51/50* (2006.01)
*H01L 27/32* (2006.01)

(52) U.S. Cl.
CPC ...... *H01L 51/5004* (2013.01); *H01L 27/3244* (2013.01); *H01L 51/508* (2013.01); *H01L 51/5076* (2013.01); *H01L 51/5092* (2013.01); *H01L 2251/552* (2013.01); *H01L 2251/558* (2013.01)

(58) Field of Classification Search
CPC ............ H01L 51/5004; H01L 51/5092; H01L 51/508; H01L 51/5076; H01L 2251/552; H01L 27/3244
See application file for complete search history.

(56) References Cited

U.S. PATENT DOCUMENTS

2018/0269416 A1* 9/2018 Hamade ............... G06K 9/0004

FOREIGN PATENT DOCUMENTS

| CN | 103594659 A | 2/2014 |
|---|---|---|
| CN | 106601921 A | 4/2017 |
| CN | 106784355 A | 5/2017 |

* cited by examiner

*Primary Examiner* — Hsien Ming Lee
(74) *Attorney, Agent, or Firm* — Tarolli, Sundheim, Covell & Tummino LLP

(57) ABSTRACT

Provided are an organic light-emitting display panel and a display device. The organic light-emitting display includes an array substrate and organic light-emitting components each having anode, cathode and organic functional layer. The organic functional layer includes an organic light-emitting layer, a first and second electron transmission layer and an electron injection layer. The first electron transmission layer and electron injection layer include a first dopant containing an alkaline earth metal element or a rare earth metal element. A work function $\varphi 1$ of the electron injection layer and a work function $\varphi 2$ of the cathode satisfy: $\varphi 1 < \varphi 2$, and the work function $\varphi 1$ of the electron injection layer and a work function $\varphi 3$ of the first dopant satisfy: $\varphi 1 \geq \varphi 3$. LUMO1 and LUMO2 satisfy: $|LUMO1 - LUMO2| < 0.18$ eV.

20 Claims, 5 Drawing Sheets

ORGANIC LIGHT-EMITTING DISPLAY PANEL AND DISPLAY DEVICE

CROSS-REFERENCE TO RELATED APPLICATIONS

The present application claims the benefit of priority to Chinese Patent Application No. 201810551430.0, filed on May 31, 2018, the content of which is incorporated herein by reference in its entirety.

TECHNICAL FIELD

The present disclosure relates to the field of display, and particularly, to an organic light-emitting display panel and a display device.

BACKGROUND

In recent years, with the development of the display technologies, various kinds of display devices have emerged in the market. For example, liquid crystal display device, organic light-emitting display device and the like have already become the mainstream products in the current display industry. The organic light-emitting display panel is the dominant trend of the display industry and becomes the hot spot of research in the display field due to its excellent characteristics of light-weight, thinness, low power consumption, high brightness, high contrast, high resolution, wide angle of view and the like.

One important component of the organic light-emitting display panel is the organic light-emitting diode. The organic light-emitting diode emits light through a light-emitting layer disposed between an anode and a cathode under an electric field applied between the anode and the cathode. In a conventional organic light-emitting diode, due to the insufficient injection and mobility of electrons, a recombination center of the holes and the electrons may deviate from the light-emitting layer, resulting in a decrease in the light-emitting efficiency of the light-emitting layer. Therefore, a problem to be solved urgently is how to further improve the injection and mobility of electrons in an organic light-emitting diode, so as to avoid a deviation of their recombination center. In this way, the performance of organic light-emitting component can be improved.

SUMMARY

The present disclosure provides an organic light-emitting display panel and a display device, for improving the injection and mobility of electrons.

In a first aspect, the present disclosure provides an organic light-emitting display panel. The organic light-emitting display panel includes: an array substrate including a plurality of driving elements; and a plurality of organic light-emitting components corresponding to the plurality of driving elements. Each of the plurality of organic light-emitting components includes an anode, a cathode and an organic functional layer disposed between the anode and the cathode. The organic functional layer includes an organic light-emitting layer, a first electron transmission layer disposed between the cathode and the organic light-emitting layer, an electron injection layer disposed between the cathode and the first electron transmission layer, and a second electron transmission layer disposed between the first electron transmission layer and the organic light-emitting layer. The first electron transmission layer includes a first dopant, and the first dopant includes an alkaline earth metal element or a rare earth metal element. The electron injection layer includes an alkaline earth metal element or a rare earth metal element, and a work function $\varphi 1$ of the electron injection layer and a work function $\varphi 2$ of the cathode satisfy: $\varphi 1 < \varphi 2$. The work function $\varphi 1$ of the electron injection layer and a work function $\varphi 3$ of the first dopant satisfy: $\varphi 1 \geq \varphi 3$. The second electron transmission layer is undoped by the first dopant, and a lowest unoccupied molecular orbital of an electron transmission matrix in the first electron transmission layer LUMO1 and a lowest unoccupied molecular orbital of an electron transmission matrix in the second electron transmission layer LUMO2 satisfy: $|LUMO1-LUMO2| < 0.18$ eV.

In a second aspect, the present disclosure provides an organic light-emitting display device including the organic light-emitting display panel as described above.

BRIEF DESCRIPTION OF DRAWINGS

In order to illustrate technical solutions of embodiments of the present disclosure or the related art, the accompanying drawings used in the embodiments or the related art are briefly introduced hereinafter. These drawings merely illustrate some embodiments of the present disclosure. On the basis of these drawings, those skilled in the art can also obtain other drawings without paying any creative effort.

DESCRIPTION OF EMBODIMENTS

Figure 1:
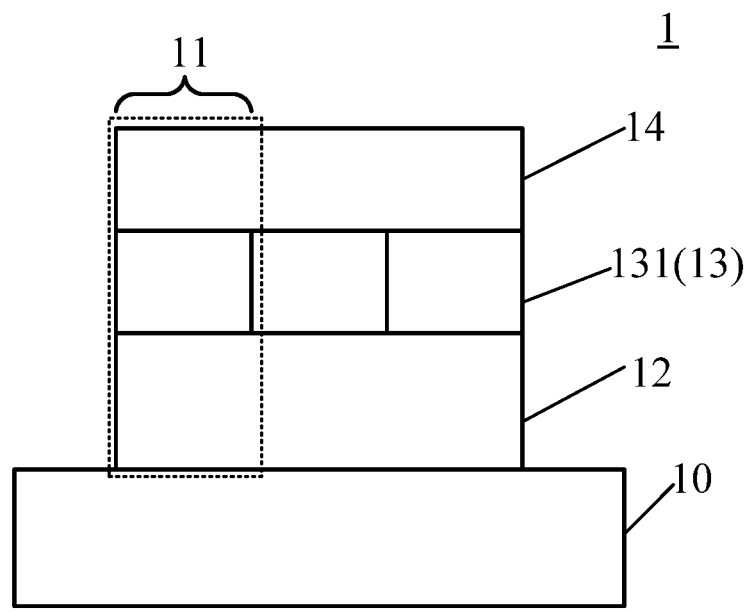
FIG. 1 is a schematic structural diagram of an organic light-emitting display panel according to an embodiment of the present disclosure.

In order to clarify the objects, technical solutions and advantages of the present disclosure, the technical solutions in the embodiments of the present disclosure will be clearly and completely described with reference to the accompanying drawings. Obviously, the described embodiments are only a part of the embodiments, rather than all of them. Based on the embodiments of the present disclosure, any other embodiments obtained by those skilled in the art shall fall into the protection scope of the present disclosure.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless indicated otherwise in the context.

It should be understood that, the term "and/or" is used in the present disclosure merely to describe relations between associated objects, and thus includes three types of relations. That is, A and/or B can represents: (a) A exists alone; (b) A and B exist at the same time; or (c) B exists alone. In addition, the character "I" generally indicates "or".

It should be understood that, although expressions "first", "second", "third" etc. are used to describe specific electron transmission layers, they shall not be interpreted as limiting the specific electron transmission layers. These expressions are merely used to distinguish among the specific electron transmission layers. For example, without departing from the scope of the present disclosure, a first electron transmission layer also can be referred as a second electron transmission layer, and vice versa.

It should be noted that, the terms such as "on", "under", "left", "right" are used to describe orientations and locations in a view angel shown in the drawings, which shall not be interpreted as limitations of the present disclosure. In addition, in the context, it should be noted that, when an element is formed "on" or "under" another element, the element can be directly formed "on" or "under" the other element, or can be indirectly formed "above" or "below" the other element through an intervening element.

Before describing the embodiments of the present disclosure in detail, a structure of a related organic light-emitting display panel and the concept of the present disclosure are briefly introduced as follows.

FIG. 1 illustrates a schematic structural diagram of an organic light-emitting display panel according to an embodiment of the present disclosure. The organic light-emitting display panel 1 includes an array substrate 10, and the array substrate 10 includes a plurality of driving elements (not shown). The organic light-emitting display panel 1 further includes a plurality of organic light-emitting components 11 corresponding to the plurality of driving elements. Each light-emitting component 11 includes an anode 12, a cathode 14 and an organic functional layer 13 arranged between the anode 12 and the cathode 14.

It should be understood that, the anode 12 is in contact with a side of the array substrate 10, and the cathode 14 is located on a side of the organic functional layer 13 facing away from the array substrate 10.

The array substrate 10 in the present embodiment can be a flexible substrate, and the corresponding organic light-emitting display panel 1 can be a flexible organic light-emitting display panel. Since the flexible organic light-emitting display panel has special characteristics such as low power consumption, bendability and the like, it is applicable to diverse kinds of display devices, especially to a wearable display device. In an embodiment, the flexible substrate is made of polyester imide or polyethylene terephthalate resin. In addition, the array substrate 10 can also be a rigid substrate, and correspondingly, the organic light-emitting display panel 1 can be a rigid organic light-emitting display panel. In fact, the present disclosure does not specifically limit the material of the organic light-emitting display panel.

In the present embodiment, during an electroluminescence process, the anode 12 is applied with a positive voltage. In the present embodiment, the anode 12 can be made of indium tin oxide. The anode 12 at least includes a reflective film located on a side of the anode 12 facing away from the array substrate 10, and the reflective film can be made of silver. The anode 12 can further include a transparent conductive thin film located on a side of the reflective film facing away from the array substrate 10, and the transparent conductive thin film can be made of indium tin oxide or indium zinc oxide.

In the present embodiment, during the electroluminescence process, the cathode 14 is applied with a negative voltage. In order to improve the capacity of injecting the electron carriers from the cathode 14 into the organic functional layer 13, the cathode 14 can be made of a material or a composite metal material having low work function, such as Ag, Al, Ca, In, Li, Mg and the like.

Figure 2:
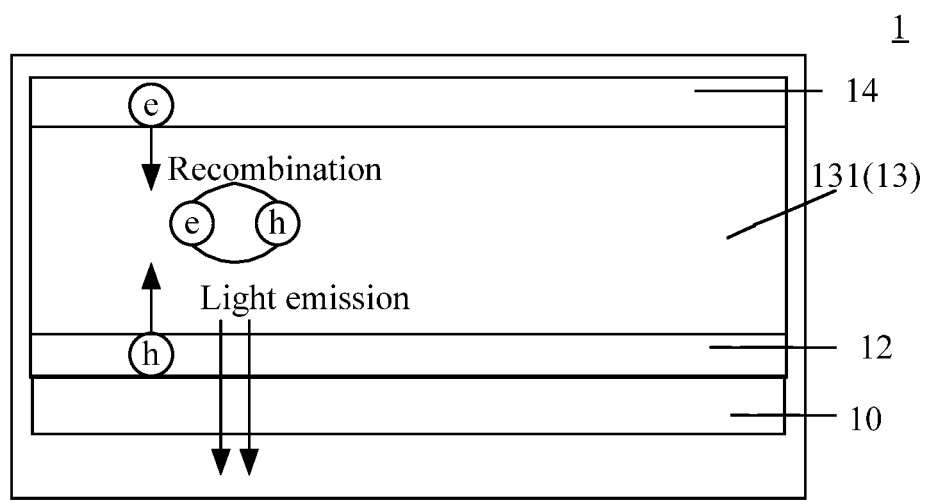
FIG. 2 is a schematic diagram of a principle of an organic light-emitting display panel according to an embodiment of the present disclosure.

FIG. 2 is a schematic diagram of a principle of an organic light-emitting display panel according to an embodiment of the present disclosure. Under an applied electric field, electrons e are injected from the cathode 14 into the organic functional layer 13, and the holes h are injected from the anode 12 to the organic functional layer 13. The injected electrons e and the injected holes h generate excitons after being recombined in the organic light-emitting layer 131. The excitons migrate under the effect of the electric field, and transfer energy to organic light-emitting molecules in the organic light-emitting layer 131. The electrons of the organic light-emitting molecules jump from a ground state to an excited state and release energy. Finally, the energy is released in a form of photons to emit light.

In the related art, due to a low mobility of electron carriers, a potential barrier at an interface between the cathode and the electron transmission layer is relatively great, which has a negative influence on the injection efficiency of electron carriers and thus affects the light-emitting efficiency.

In order to solve the above problem, the present disclosure provides following technical solutions.

Figure 3:
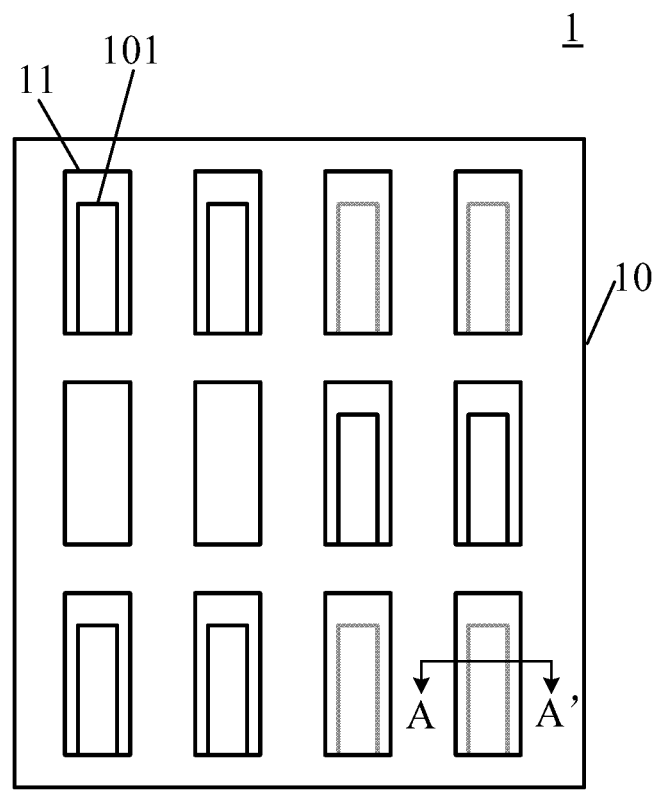
FIG. 3 is another schematic structural diagram of an organic light-emitting display panel according to an embodiment of the present disclosure.
Figure 4:
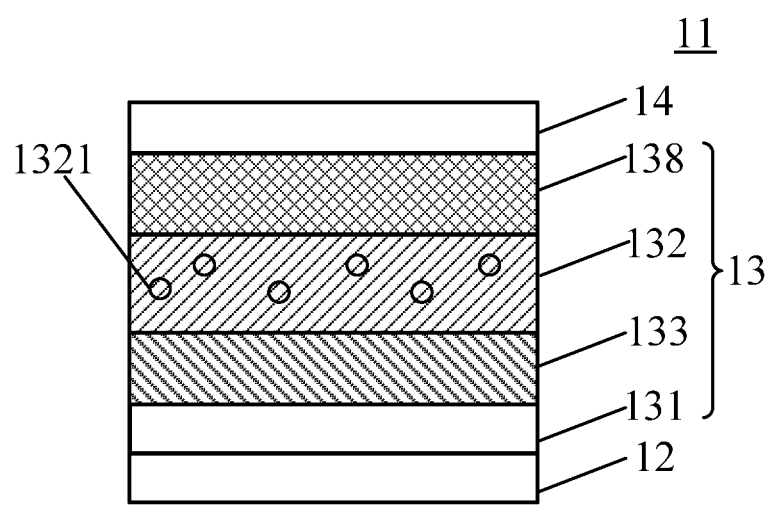
FIG. 4 is a cross-sectional view of an organic light-emitting component according to an embodiment of the present disclosure along AA' line in FIG. 3.

The present disclosure provides an organic light-emitting display panel, as shown in FIG. 3 and FIG. 4, where FIG. 3 is another schematic structural diagram of an organic light-emitting display panel according to an embodiment of the present disclosure, and FIG. 4 is a cross-sectional view of an organic light-emitting component according to an embodiment of the present disclosure along AA' line in FIG. 3. As shown in FIG. 3, the organic light-emitting display panel 1 includes an array substrate 10, and the array substrate 10 includes a plurality of driving elements 101. In order to illustrate a relation between the driving elements and the organic light-emitting components, the organic light-emitting components in FIG. 3 are set to have a transparency of 60%, so that the driving elements 101 covered by the organic light-emitting components can be viewed.

Referring to FIG. 4, the organic light-emitting display panel 1 further includes an organic light-emitting component 11 corresponding to a driving element 101. The organic light-emitting component 11 includes an anode 12, a cathode 14 and an organic functional layer 13 disposed between the anode 12 and the cathode 14. The organic functional layer 13 includes an organic light-emitting layer 131, a first electron transmission layer 132 disposed between the cathode 14 and the organic light-emitting layer 131, an electron injection layer 138 disposed between the cathode 14 and the first electron transmission layer 132, and a second electron transmission layer 133 disposed between the first electron transmission layer 132 and the organic light-emitting layer 131.

The first electron transmission layer 132 includes a first dopant 1321, and the first dopant 1321 includes an alkaline earth metal element or a rare earth metal element.

The electron injection layer 138 also includes an alkaline earth metal element or a rare earth metal element. A work function $\varphi1$ of the electron injection layer 138 and a work function $\varphi2$ of the cathode 14 satisfy: $\varphi1<\varphi2$, and the work function $\varphi1$ of the electron injection layer 138 and a work function $\varphi3$ of the first dopant 1321 satisfy: $\varphi1\geq\varphi3$.

The second electron transmission layer 133 does not include the first dopant 1321. In addition, a lowest unoccupied molecular orbital of an electron transmission matrix in the first electron transmission layer 132 LUMO1 and a lowest unoccupied molecular orbital of an electron transmission matrix in the second electron transmission layer 133 LUMO2 satisfy: |LUMO1−LUMO2|<0.18 eV.

In the present embodiment, since both the first electron transmission layer 132 and the electron injection layer 138 disposed between the cathode 14 and the organic light-emitting layer 131 include an alkaline earth metal element or a rare earth metal element, the mobility of electrons generated by the cathode 14, with which the electrons migrate to the organic light-emitting layer 131, can be improved. Further, a second electron transmission layer 133 is arranged between the first electron transmission layer 132 and the organic light-emitting layer 131 and includes no first dopant 1321, so that the first dopant 1321 is prevented from diffusing to the organic light-emitting layer 131 and thus photons generated by recombining the electrons and holes are prevented from being absorbed by the first dopant, and thus the light-emitting efficiency of the organic display panel is guaranteed. In addition, the lowest unoccupied molecular orbital of the electron transmission matrix in the first electron transmission layer 132 LUMO1 and the lowest unoccupied molecular orbital of the electron transmission matrix in the second electron transmission layer 133 LUMO2 satisfy: |LUMO1−LUMO2|<0.18 eV, i.e., an energy level difference between these two lowest unoccupied molecular orbitals is relatively small, which is conductive to the migration of electron carriers to the organic light-emitting layer 131 and thus improves the mobility of electron carriers. In the meantime, the small energy level difference leads to a low potential barrier for injecting the electron carriers, so as to improve an injection efficiency of electron carriers. In the present embodiment, the work function $\varphi1$ of the electron injection layer 138 and a work function $\varphi2$ of the cathode 14 satisfy: $\varphi1<\varphi2$, which results in a small energy level difference therebetween and is conductive to the transition of electron carriers. Moreover, the work function $\varphi1$ of the electron injection layer 138 and the work function $\varphi3$ of the first dopant 1321 satisfy: $\varphi1\geq\varphi3$, i.e., the work function of the electron injection layer 138 is greater than or equal to the work function of the first dopant 1321, which is helpful to the migration of electron carriers toward the organic light-emitting layer 131. Meanwhile, an energy level gradient of electron transition is formed in a direction from the cathode 14 to the organic light-emitting layer 131, so that the electrons will not span a high energy level and will not accumulate at the interface, thereby improving the injection of electrons and enhancing a response speed of the organic light-emitting component.

Figure 5:
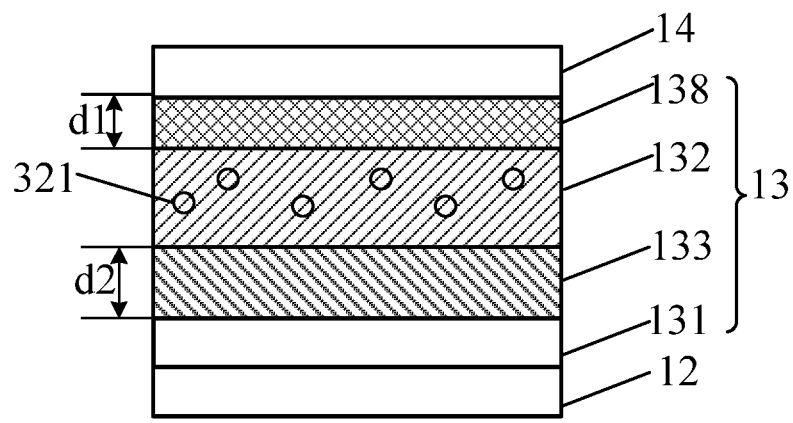
FIG. 5 is a cross-sectional view of an organic light-emitting component according to another embodiment of the present disclosure along AN line in FIG. 3.

FIG. 5 is a cross-sectional view of an organic light-emitting component according to an embodiment of the present disclosure along AA' line in FIG. 3, where the electron injection layer 138 has a thickness of d1 satisfying d1≤5 nm.

Since the electron injection layer 138 contains an alkaline earth metal element or a rare earth metal element, with an increasing of thickness thereof, a corresponding doping amount is also increased, thereby enhancing the electron carrier injection efficiency. However, if the electron injection layer 138 is too thick, the light transmittance can be affected, which in turn can affect the light extraction efficiency of the organic light-emitting display panel 1. In the present embodiment, the thickness of the electron injection layer 138 described above is set after reaching a balance between the electron carrier injection efficiency and the light transmittance.

In an embodiment, the first dopant 1321 is doped in the first electron transmission layer 132 in a volume percentage of 0.5% to 7%. With an increasing of the volume percentage of the first dopant 1321 doped in the first electron transmission layer 132, the mobility of electron carriers is greater. However, considering that the first dopant 1321 includes an alkaline earth metal element or a rare earth metal element, the light transmittance of the first electron transmission layer 132 may be influenced. Therefore, the volume ratio of the first dopant 1321 doped in the first electron transmission layer 132 is set in the present embodiment, in order to balance the mobility of the electron carrier and the light transmittance of the first electron transmission layer 132. When the volume percentage of the first dopant 1321 doped in the first electron transmission layer 132 is smaller than 0.5%, the mobility of the electron carriers will be affected. When the volume percentage of the first dopant 1321 doped in the first electron transmission layer 132 is greater than 7%, the light transmittance of the first electron transmission layer 132 will be reduced, which in turn affects a quantity of the emitted light of the organic light-emitting display panel 1. For example, when the volume percentage of the first dopant 1321 doped in the first electron transmission layer 132 is in the range of 0.5%-7%, the light transmittance of the first electron transmission layer 132 is greater than 65%.

In the embodiment, referring to FIG. 5, the second electron transmission layer 133 has a thickness of d2 satisfying: 2 nm≤d2≤60 nm. In combination with the embodiment described above, since the second electron transmission layer 133 includes no first dopant, the influence of the first dopant on the organic light-emitting layer 131 can be avoided. Therefore, the second transmission layer 133 should not be too thin. For example, the thickness d2 of the second electron transmission layer 133 is in range of 2 nm≤d2≤60 nm.

In an embodiment, a material of the electron injection layer 138 is the same as a material of the first dopant 1321. For example, the first dopant 1321 can be a rare earth metal Yb. Similarly, the electron injection layer 138 can be a rare earth metal Yb. The materials are the same, so that a migration pathway of the electron carriers is prolonged, much closer to the organic light-emitting layer 131, and the electron carriers can easily migrate into the organic light-emitting layer 131.

In another embodiment, the material of the electron injection layer 138 is different from the material of the first dopant 1321. For example, the electron injection layer 138 can be a rare earth metal Yb, while the first dopant can be Mg, Ga, Y, Gd, Lu, Sm or Tm. The electron injection layer 138 can reduce the interface barrier between itself and the cathode, facilitating the injection of electron carriers, and the first electron transmission layer 132 can increase the mobility of the electron carriers, so that the electron carriers can migrate into the organic light-emitting layer 131 in a short time. That is, the functions of these two are different, and thus the materials thereof are different.

In an embodiment, the work function $\varphi 1$ of the electron injection layer and the work function $\varphi 2$ of the cathode 14 satisfy: $\varphi 2-\varphi 1<1.66$ ev, and the work function $\varphi 1$ of the electron injection layer 138 and the work function $\varphi 3$ of the first dopant 1321 satisfy: $\varphi 1-\varphi 3 \geq 0.14$ ev. Once these work functions satisfy the above relationship, the electron carrier will migrate toward the organic light-emitting layer 131, which increases an amount of the electron carriers in the organic light-emitting layer 131 and thus enhances the light-emitting efficiency.

In an embodiment, the electron injection layer 138 includes one metal element of an alkaline earth metal element and a rare earth metal element, and the first dopant 1321 includes at least two metal elements of an alkaline earth metal element and a rare earth metal element. Since there is a large amount of the alkaline earth metal element and the rare earth metal element, it can be understood that the electron injection layer 138 in this embodiment includes only one of the large amount of metal elements, such as Yb. The first dopant 1321 includes at least two of the large amount of metal elements, for example, any two metal elements from Mg, Ga, Yb, Sm, Tm, Y, Gd, and Lu.

Further, in an embodiment, the electron injection layer 138 is made of a material of an alkaline earth elementary metal, a rare earth elementary metal or a metal oxide. For example, when the electron injection layer is an alkaline earth elementary metal, it can be Mg or Ga; when the electron injection layer is a rare earth elementary metal, it can be Yb, Sm, Tm, Y, Gd or Lu; and when the electron injection layer is a metal oxide, it can be magnesium oxide or calcium oxide, or a metal halide, such as lithium fluoride, or a metal complex, such as lithium quinoline.

In an embodiment, the first dopant 1321 may include any one of Mg and Ga, or the first dopant 1321 can include at least one of lanthanide series of rare earth metal elements Yb, Sm and Tm, or the first dopant 1321 can include at least one of rare earth metal elements Y, Gd and Lu.

Since the first dopant 1321 includes at least one of Mg, Ga, Yb, Sm, Tm, Y, Gd or Lu, the first electron transmission layer 132 containing the first dopant 1321 can effectively improve the mobility and injection efficiency of the electron carriers, thereby improving the light-emitting effect of the organic light-emitting display panel 1.

Further, the first dopant 1321 can be an alkaline earth elementary metal element or a rare earth elementary metal element. That is, the first dopant 1321 doped into the first electron transmission layer 132 exists in a form of an elementary metal.

In an embodiment, the first dopant 1321 can be a metallic compound. That is, the first dopant 1321 doped into the first electron transmission layer 132 exists in a form of a metallic compound. For example, the metallic compound can be a metal oxide, such as magnesium oxide or calcium oxide; or the metallic compound can be a metal halide, such as lithium fluoride; or the metallic compound can be a metal complex, such as lithium quinoline.

It should be noted that the first dopant 1321 can improve the mobility of electron carriers and reduce the potential barrier of injecting electrons carrier, despite of the form of the first dopant 1321 existing in the first electron transmission layer 132.

Figure 6:
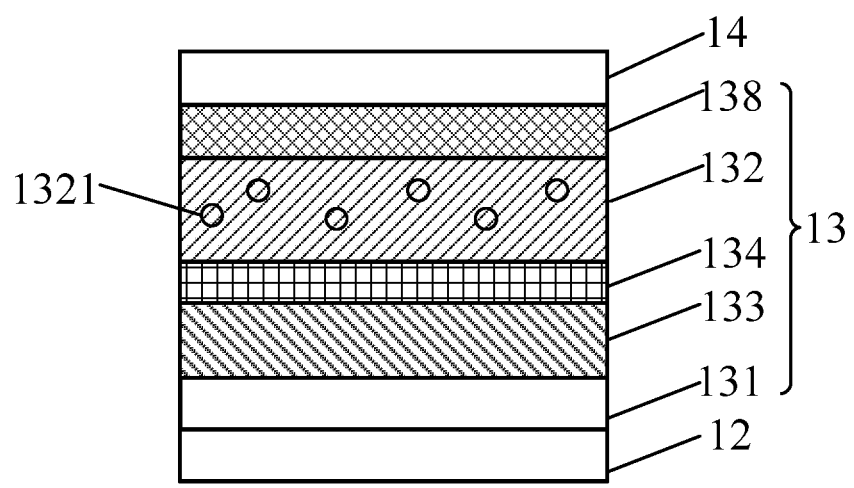
FIG. 6 is a cross-sectional view of an organic light-emitting component according to yet another embodiment of the present disclosure along AA' line in FIG. 3.

Further, FIG. 6 is a cross-sectional view of an organic light-emitting component according to yet another embodiment of the present disclosure along AA' line in FIG. 3. In this embodiment, the organic functional layer 13 further includes a third electron transmission layer 134 disposed between the first electron transmission layer 132 and the second electron transmission layer 133.

In the present embodiment, since the third electron transmission layer 134 is arranged between the first electron transmission layer 132 and the second electron transmission layer 133, a distance between the first electron transmission layer 132 including the first dopant 1321 and the organic light-emitting layer 131 increases, and thus the influence of the first dopant 1321 on the organic light-emitting layer 131 can be further blocked. In this way, the photons generated by the organic light-emitting layer 131 are prevented from being absorbed by the alkaline earth metal element or the rare earth metal element included in the first dopant 1321.

Moreover, during the transition of the electrons from the cathode 14 to the organic light-emitting layer 131, the electrons firstly transit from the first electron transmission layer 132 to the third electron transmission layer 134, and then transit to the second electron transmission layer 133, so as to form an energy level gradient of electron transition. In this way, electrons do not need to span the high energy level, thereby avoiding an accumulation of electrons at the interface, facilitating the injection of electrons, and improving a response speed of the organic light-emitting component.

In an embodiment, no first dopant 1321 is doped in the third electron transmission layer 134. In the present embodiment, since the third electron transmission 134 is not doped with the first dopant 1321, the influence of the first dopant 1321 on the organic light-emitting layer 131 can be avoided.

Figure 7:
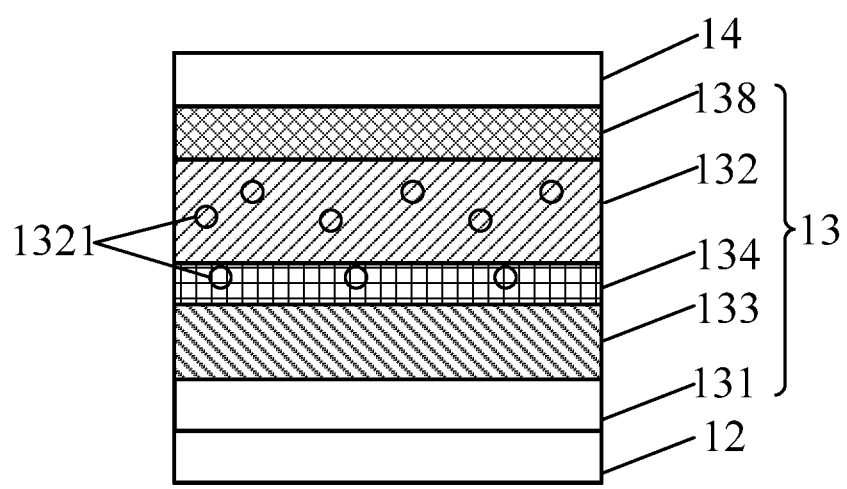
FIG. 7 is a cross-sectional view of an organic light-emitting component according to yet another embodiment of the present disclosure along AA' line in FIG. 3.

Further, FIG. 7 is a cross-sectional view of an organic light-emitting component according to yet another embodiment of the present disclosure along AA' line in FIG. 3. In this embodiment, the third electron transmission layer 134 is doped with the first dopant 1321. A doping concentration of the first dopant 1321 in the third electron transmission layer 134 is smaller than a doping concentration of the first dopant 1321 in the first electron transmission layer 132.

In this embodiment, since the doping concentration of the first dopant 1321 in the third electron transmission layer 134 is smaller than the doping concentration of the first dopant 1321 in the first electron transmission layer 132, a doping concentration gradient of the first dopant 1321 is formed in a direction from the cathode 14 to the organic light-emitting layer 131. In this way, the electrons do not need to span the high energy level, thereby avoiding an accumulation of electrons at the interface, facilitating the injection of electrons, and improving a response speed of the organic light-emitting component.

In addition, the third electron transmission layer 134 is closer to the organic light-emitting layer 131 than the first electron transmission layer 132. Only when the concentration of the first dopant 1321 in the third electron transmission layer 134 is smaller than the concentration of the first dopant 1321 in the first electron transmission layer 132, it can be ensured that the first dopant 1321 will not diffuse in the second electron transmission layer 133 and does not affect the organic light-emitting layer 131.

According to the above embodiment, even the third electron transmission layer 134 includes the first dopant 1321, the second electron transmission layer 133 is disposed between the third electron transmission layer 134 and the organic light-emitting layer 131, and the second electron transmission layer 133 does not include the first dopant 1321, so that the first dopant 1321 can be effectively prevented from entering the organic light-emitting layer 131.

In addition, since the third electron transmission layer 134 is provided with the first dopant 1321, the potential barrier of injecting the electron carriers from the first electron transmission layer 132 into the third electron transmission layer 134 is lowered, and the transition of the electron carriers can be utilized.

Further, still referring to FIG. 7, a concentration of the first dopant 1321 at a side of the third electron transmission layer 134 close to the first electron transmission layer 132 is greater than a concentration of the first dopant 1321 at a side of the third electron transmission layer 134 away from the first electron transmission layer 132. In other words, since the concentration of the first dopant 1321 in the first electron transmission layer 132 is greater, the first dopant will diffuse toward the third electron transmission layer 134, so that the concentration of the first dopant at the side of the third electron transmission layer 134 close to the first electron transmission layer 132 is greater.

In the present embodiment, since the concentration of the first dopant 1321 in the third electron transmission layer 134 gradually decreases in the direction from the cathode 14 to the organic light-emitting layer 131, it can effectively prevent the first dopant 1321 from diffusing to the second electron transmission layer 133 and affecting the organic light-emitting layer 131.

In a further embodiment, a material of the electron transmission matrix in the third electron transmission layer 134 is the same as a material of the electron transmission matrix in the first electron transmission layer 132. For example, the electron transmission matrix of the third electron transmission layer 134 can be made of bipyridine, triazine ring or lithium quinoline or the like, thereby improving the mobility of electron carriers and the injection efficiency of electron carriers.

Alternatively, the material of the electron transmission matrix in the third electron transmission layer 134 is the same as a material of the electron transmission matrix in the second electron transmission layer 133. For example, the electron transmission matrix of the third electron transmission layer 134 can be made of carbazole material, thiophene material, fluorene material or a spiro material, so that the mobility of the hole carrier can be suppressed, thereby preventing the electron carriers and hole carriers from being accumulated and recombined in the third electron transmission layer 134.

In an embodiment, a highest occupied molecular orbital HOMO2 of the second electron transmission layer 133 and a highest occupied molecular orbital HOMO3 of a host material in the organic light-emitting layer 131 satisfy: |HOMO2−HOMO3|<1 eV. In the direction from the cathode 14 to the organic light-emitting layer 131, a part of the electron carriers can overcome the potential barrier and transit to the high energy level. Once the highest occupied molecular orbital HOMO2 of the second electron transmission layer 133 and the highest occupied molecular orbital HOMO3 of the host material in the organic light-emitting layer 131 satisfy the above relationship, the mobility of the hole carrier can be suppressed, and the electron carriers are prevented from being recombined with the hole carriers before reaching the organic light-emitting layer, thereby avoid affecting the light-emitting efficiency.

Figure 8:
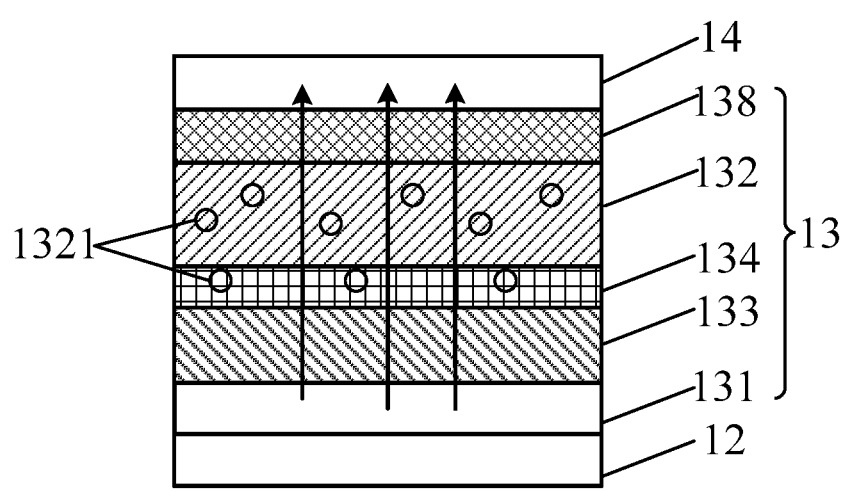
FIG. 8 is another schematic structural diagram of an organic light-emitting display panel according to an embodiment of the present disclosure.

FIG. 8 is another structural schematic diagram of an organic light-emitting display panel according to an embodiment of the present invention. In this embodiment, the light emitted from the organic light-emitting component 11 is emitted toward the cathode 14, and a structure between the second electron transmission layer 133 and the cathode 14 has a transmittance of T≥65% for the light emitted from the organic light-emitting layer 131. In the present embodiment, the expression "the light emitted from the organic light-emitting device 11 is emitted toward the cathode 14" can be interpreted as a top emission structure. In order to ensure the light generated by the organic light-emitting layer 131 to be emitted from the cathode and to prevent the interlayer between the organic light-emitting layer 131 and the cathode 14 from affecting the light, the transmittance of each layer should be controlled. Specifically, the structure between the second electron transmission layer 133 and the cathode 14 has a transmittance of T≥65% for the light emitted from the organic light-emitting layer 131, which in turn can guarantee the light-emitting efficiency.

Figure 9:
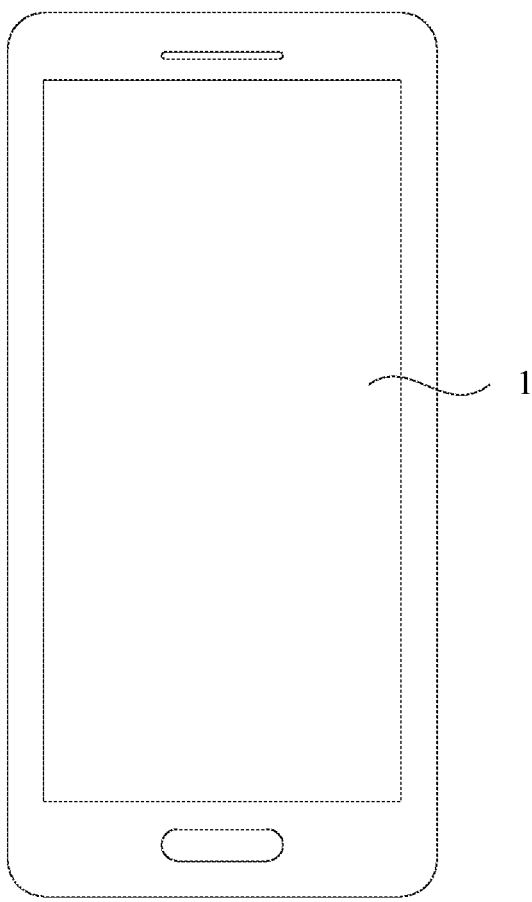
FIG. 9 is a schematic structural diagram of an organic light-emitting display device according to an embodiment of the present disclosure.

FIG. 9 is a schematic structural diagram of an organic light-emitting display device according to an embodiment of the present disclosure. The organic light-emitting display device 500 includes the organic light-emitting display panel 1 described above. It should be noted that, although a mobile phone is taken as an example in FIG. 9, the organic light-emitting display device is not limited thereto. Specifically, the organic light-emitting display device can include but not limited to electronic devices having display function such as personal computer (PC), personal digital assistant (PDA), wireless handhold device, tablet computer, MP4 player, television, or the like.

In the present disclosure, the organic light-emitting display device 500 includes the above organic light-emitting display panel 1, and thus the organic light-emitting display device 500 can achieve all the beneficial effects accomplished by the above organic light-emitting display panel 1. That is, both the first electron transmission layer 132 and the electron injection layer 138 disposed between the cathode 14 and the organic light-emitting layer 131 include an alkaline earth metal element or a rare earth metal element, so that the mobility of electron from cathode 14 to the organic light-emitting layer 131 can be improved. In addition, a second electron transmission layer 133 is arranged between the first electron transmission layer 132 and the organic light-emitting layer 131. Since the second electron transmission layer 133 does not include the first dopant 1321, the first dopant 1321 can be effectively prevented from diffusing to the organic light-emitting layer 131, which in turn prevents the photons generated by recombining the electrons and holes from being absorbed by the first dopant, thereby guaranteeing the light-emitting efficiency of the organic light-emitting panel. Moreover, the lowest unoccupied molecular orbital of the electron transmission matrix in the first electron transmission layer 132 LUMO1 and the lowest unoccupied molecular orbital of the electron transmission matrix in the second electron transmission layer 133 LUMO2 satisfy: |LUMO1−LUMO2|<0.18 eV, i.e., the energy level difference between these two lowest unoccupied molecular orbitals is relatively small, which is conductive to the migration of electron carriers to the organic light-emitting layer 131 and thus improves the mobility of electron carriers. In the meantime, the small energy level difference leads to a low potential barrier of injecting the electron carriers, so as to improve an injection efficiency of electron carriers. In the present embodiment, the work function φ1 of the electron injection layer 138 and the work function φ2 of the cathode 14 satisfy: φ1<φ2, which results in a small energy level difference therebetween and is conductive to the transition of electron carriers. In addition, the work function φ1 of the electron injection layer 138 and the work function φ3 of the first dopant 1321 satisfy: φ1≥φ3. It can be understood that, the work function of the electron injection layer 138 is larger than or equal to the work function of the first dopant 1321, which is helpful to the migration of electron carriers toward the organic light-emitting layer 131. Meanwhile, an energy level gradient of electron transition is formed in a direction from the cathode 14 to the organic light-emitting layer 131, so that the electrons will not span a high energy level and will not accumulate at the interface, thereby improving the injection of electrons and enhancing a response speed of the organic light-emitting component.

Finally, it should be noted that the above embodiments are used to illustrate, but not to limit the technical solutions of the present disclosure. Although the present disclosure is illustrated in detail with reference to the above embodiments, those skilled in the art can still modify the technical solutions recorded in the above embodiments, or equivalently replace part or all of the technical features. However, any modification or replacement will not lead to a derivation of the essence of the technical solutions from the scope of the embodiments of the present disclosure.

What is claimed is:

1. An organic light-emitting display panel, comprising:
    an array substrate comprising a plurality of driving elements; and
    a plurality of organic light-emitting components corresponding to the plurality of driving elements, wherein each of the plurality of organic light-emitting components comprises an anode, a cathode and an organic functional layer disposed between the anode and the cathode, and wherein the organic functional layer comprises an organic light-emitting layer, a first electron transmission layer disposed between the cathode and the organic light-emitting layer, an electron injection layer disposed between the cathode and the first electron transmission layer, and a second electron transmission layer disposed between the first electron transmission layer and the organic light-emitting layer,
    wherein the first electron transmission layer comprises a first dopant, and the first dopant comprises an alkaline earth metal element or a rare earth metal element,
    wherein the electron injection layer comprises an alkaline earth metal element or a rare earth metal element, and a work function $\varphi 1$ of the electron injection layer and a work function $\varphi 2$ of the cathode satisfy: $\varphi 1 < \varphi 2$,
    wherein the work function $\varphi 1$ of the electron injection layer and a work function $\varphi 3$ of the first dopant satisfy: $\varphi 1 \geq \varphi 3$, and
    wherein the second electron transmission layer is undoped by the first dopant, and a lowest unoccupied molecular orbital of an electron transmission matrix in the first electron transmission layer LUMO1 and a lowest unoccupied molecular orbital of an electron transmission matrix in the second electron transmission layer LUMO2 satisfy: |LUMO1−LUMO2|<0.18 eV.

2. The organic light-emitting display panel according to claim 1, wherein the electron injection layer has a thickness d1 satisfying d1≤5 nm.

3. The organic light-emitting display panel according to claim 1, wherein the first dopant is doped in the first electron transmission layer in a volume percentage of 0.5% to 7%.

4. The organic light-emitting display panel according to claim 1, wherein the second electron transmission layer has a thickness d2 satisfying: 2 nm≤d2≤60 nm.

5. The organic light-emitting display panel according to claim 1, wherein a material of the electron injection layer is a same material as a material of the first dopant.

6. The organic light-emitting display panel according to claim 1, wherein a material of the electron injection layer is different from a material of the first dopant.

7. The organic light-emitting display panel according to claim 1, wherein the work function $\varphi 1$ of the electron injection layer and the work function $\varphi 2$ of the cathode satisfy: $\varphi 2 - \varphi 1 \leq 1.66$ ev, and
    wherein the work function $\varphi 1$ of the electron injection layer and the work function $\varphi 3$ of the first dopant satisfy: $\varphi 1 - \varphi 3 \geq 0.14$ ev.

8. The organic light-emitting display panel according to claim 1, wherein the electron injection layer comprises one metal element selected from an alkaline earth metal element and a rare earth metal element, and
    wherein the first dopant comprises at least two metal elements selected from an alkaline earth metal element and a rare earth metal element.

9. The organic light-emitting display panel according to claim 1, wherein the first dopant comprises at least one of Mg, Ga, Yb, Sm, Tm, Y, Gd or Lu.

10. The organic light-emitting display panel according to claim 1, wherein the first dopant comprises at least one selected from an alkaline earth elementary metal element and a rare earth elementary metal element.

11. The organic light-emitting display panel according to claim 1, wherein the first dopant is a metallic compound.

12. The organic light-emitting display panel according to claim 1, wherein the electron injection layer is made of a material of an alkaline earth elementary metal, a rare earth elementary metal or a metal oxide.

13. The organic light-emitting display panel according to claim 1, wherein the organic functional layer further comprises a third electron transmission layer disposed between the first electron transmission layer and the second electron transmission layer.

14. The organic light-emitting display panel according to claim 13, wherein the third electron transmission layer is undoped by the first dopant.

15. The organic light-emitting display panel according to claim 13, wherein the third electron transmission layer is doped with the first dopant, and
    wherein a doping concentration of the first dopant in the third electron transmission layer is smaller than a doping concentration of the first dopant in the first electron transmission layer.

16. The organic light-emitting display panel according to claim 15, wherein a doping concentration of the first dopant at a side of the third electron transmission layer close to the first electron transmission layer is greater than a doping concentration of the first dopant at a side of the third electron transmission layer away from the first electron transmission layer.

17. The organic light-emitting display panel according to claim 13, wherein a material of an electron transmission matrix in the third electron transmission layer is a same material as a material of an electron transmission matrix in the first electron transmission layer, or
    the material of the electron transmission matrix in the third electron transmission layer is a same material as a material of an electron transmission matrix in the second electron transmission layer.

18. The organic light-emitting display panel according to claim 1, wherein a highest occupied molecular orbital of the second electron transmission layer HOMO2 and a highest occupied molecular orbital of a host material in the organic light-emitting layer HOMO3 satisfy: |HOMO2−HOMO3|<1 eV.

19. The organic light-emitting display panel according to claim 1, wherein light emitted from one of the plurality of organic light-emitting components is emitted toward the cathode, and a structure between the second electron transmission layer and the cathode has a transmittance of T≥65% for light emitted from the organic light-emitting layer.

20. An organic light-emitting display device, comprising the organic light-emitting display panel according to claim 1.

* * * * *